United States Patent
Galbi et al.

[11] Patent Number: 5,847,575
[45] Date of Patent: Dec. 8, 1998

[54] METHOD AND APPARATUS FOR PERFORMING SWITCHED SUPPLY DRIVE IN CMOS PAD DRIVERS

[75] Inventors: Duane Galbi, Marlborough; Chris L. Houghton, Westborough; John A. Kowaleski, Jr., Princeton, all of Mass.

[73] Assignee: Digital Equipment Corporation, Maynard, Mass.

[21] Appl. No.: 668,170

[22] Filed: Jun. 21, 1996

[51] Int. Cl.$^6$ .................... H03K 19/0185; H03K 17/16
[52] U.S. Cl. .................... 326/27; 326/86; 326/87
[58] Field of Search .................... 326/21, 26, 27–28, 326/82, 86, 87

[56] References Cited

U.S. PATENT DOCUMENTS

| | | | |
|---|---|---|---|
| 4,731,553 | 3/1988 | Van Lehn et al. | 307/443 |
| 5,063,308 | 11/1991 | Borkar | 326/26 |
| 5,319,260 | 6/1994 | Wanlass | 326/21 X |
| 5,493,232 | 2/1996 | Kube | 326/27 |
| 5,500,610 | 3/1996 | Burstein | 326/27 X |
| 5,523,702 | 6/1996 | Maeda | 326/26 |
| 5,585,740 | 12/1996 | Tipon | 326/26 |
| 5,652,527 | 7/1997 | Phillips et al. | 326/27 X |

*Primary Examiner*—Jon Santamauro
*Attorney, Agent, or Firm*—Christopher J. Cianciolo

[57] ABSTRACT

A driver circuit for limiting electrical noise on a quiescent signal is provided which includes a Transition High Driver circuit, a Transition Low Driver circuit, a Quiescent High Driver circuit, and a Quiescent Low Driver circuit. The driver circuit comprises means for driving an electrical signal with a presumed noisy Transition Power Supply network while it is transitioning from a low voltage level to a high voltage level or vice versa. The signal is driven by the Transition Power Supply network until the electrical signal reaches its quiescent voltage level. At this time, the signal is no longer driven by the Transition Power Supply network but rather by a presumed clean Quiescent Power Supply network. In this manner, noise from transitioning signals is prevented from coupling onto quiescent signals.

16 Claims, 7 Drawing Sheets

METHOD AND APPARATUS FOR PERFORMING SWITCHED SUPPLY DRIVE IN CMOS PAD DRIVERS

BACKGROUND OF THE INVENTION

This invention relates generally to integrated circuits and more specifically to switched supply drives in CMOS integrated circuits (IC's).

As it is known in the art, the average current consumed by a chip pad output driver for CMOS VLSI chips is typically not large compared to that of the chip core. However, since many pads typically switch at the same time, the peak current required by the pads can be substantial. For small VLSI chips, driving the core and the off-chip output drivers using the same power supply network results in supply transients that degrade the chip's core performance.

A common solution to this problem is to separate the output pads and the core logic of the chip such that they each have their own dedicated power supply network with dedicated power and ground pins. To keep the switching noise of one group of output pads from affecting other groups of output pads the following strategy is typically followed. The output pads are grouped such that each asynchronous interface, i.e. each group of pads which needs to be valid while another group is switching, has its own dedicated power supply network and its own dedicated power and ground pins.

One drawback of this approach is that it significantly increases the number of power supply networks on an integrated circuit. Increasing the number of power supply networks reduces the available area and pins for routing critical signals. Therefore, it would be desirable to limit the number of power supply networks used in the design.

SUMMARY OF THE INVENTION

In accordance with the present invention, a circuit for limiting electrical noise while driving an output signal is disclosed which includes a first circuit portion for driving an output signal from a transition power supply network when it is transitioning from a low state to a high state, a second circuit portion for driving an output signal with a Quiescent Power Supply network when it is in a quiescent high state, a third circuit portion for driving an output signal with a Transition Power Supply ground network when it is transitioning from a high state to a low state, and a fourth circuit portion for driving an output signal with a Quiescent Power Supply ground network when it is in a quiescent low state.

With such an arrangement, a driver circuit is provided that limits noise on quiescent signals, which can be implemented in integrated circuits or in computer systems employing integrated circuits and which will not significantly reduce the available area or pins for routing critical signals.

BRIEF DESCRIPTION OF THE DRAWINGS

The foregoing features of this invention, as well as the invention itself, may be more fully understood from the following detailed description when read in conjunction with the accompanying drawings, in which.

DESCRIPTION OF A PREFERRED EMBODIMENT

Figure 1:
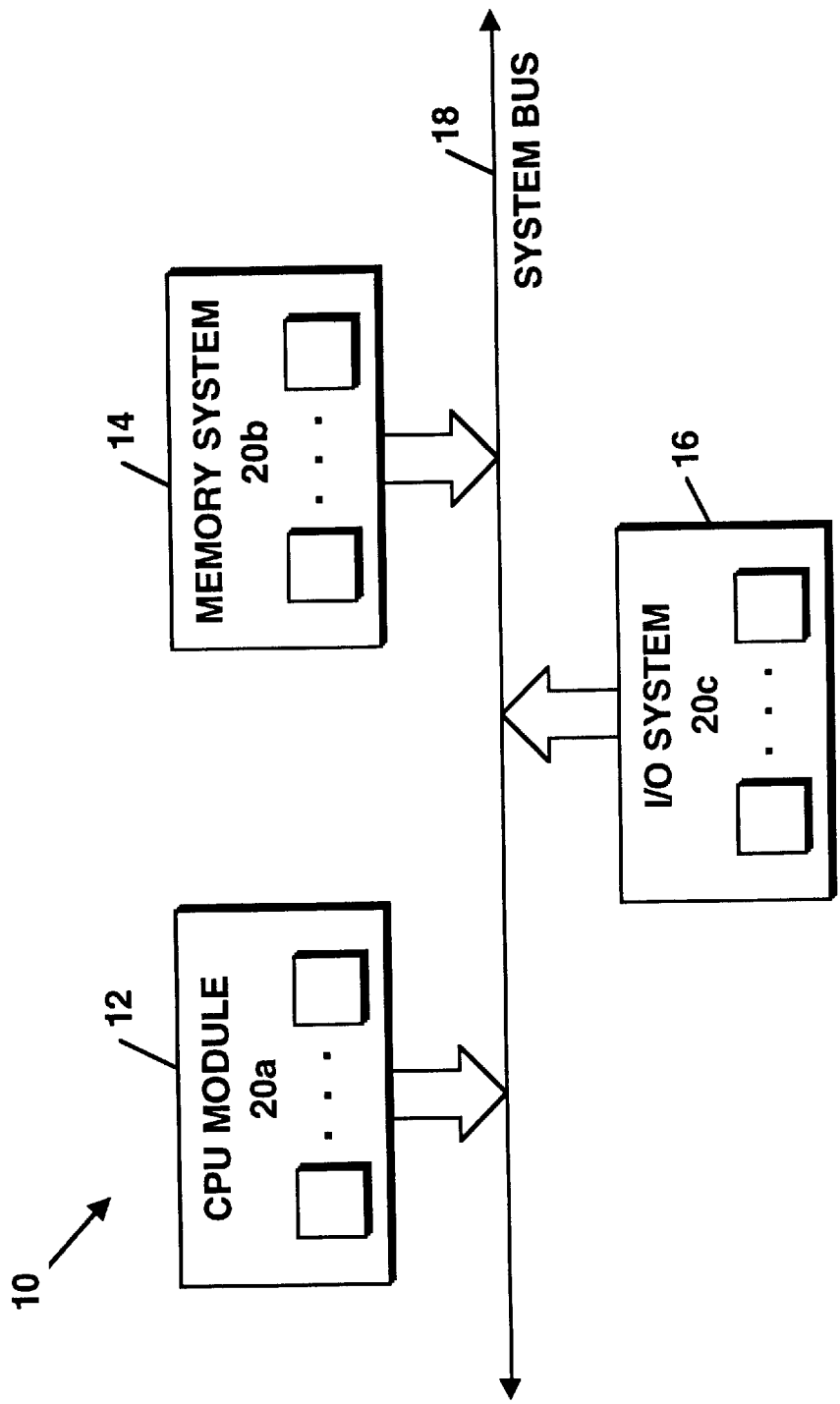
FIG. 1 depicts a block diagram of a computer system in which the present invention may be applied.

Referring to FIG. 1, a computer system 10 is shown to include a central processing unit (CPU) 12, a memory system 14, and an input/output (I/O) system 16, interconnected by a system bus 18. Each portion of the computer system 10 further comprises groups of coupled integrated circuits 20a, 20b, 20c. The purpose of each integrated circuit is to perform logic functions within its core logic area, the results of which are presented to the input/output (I/O) pads of the integrated circuit to be passed to other integrated circuits or to other parts of the system.

Figure 2:
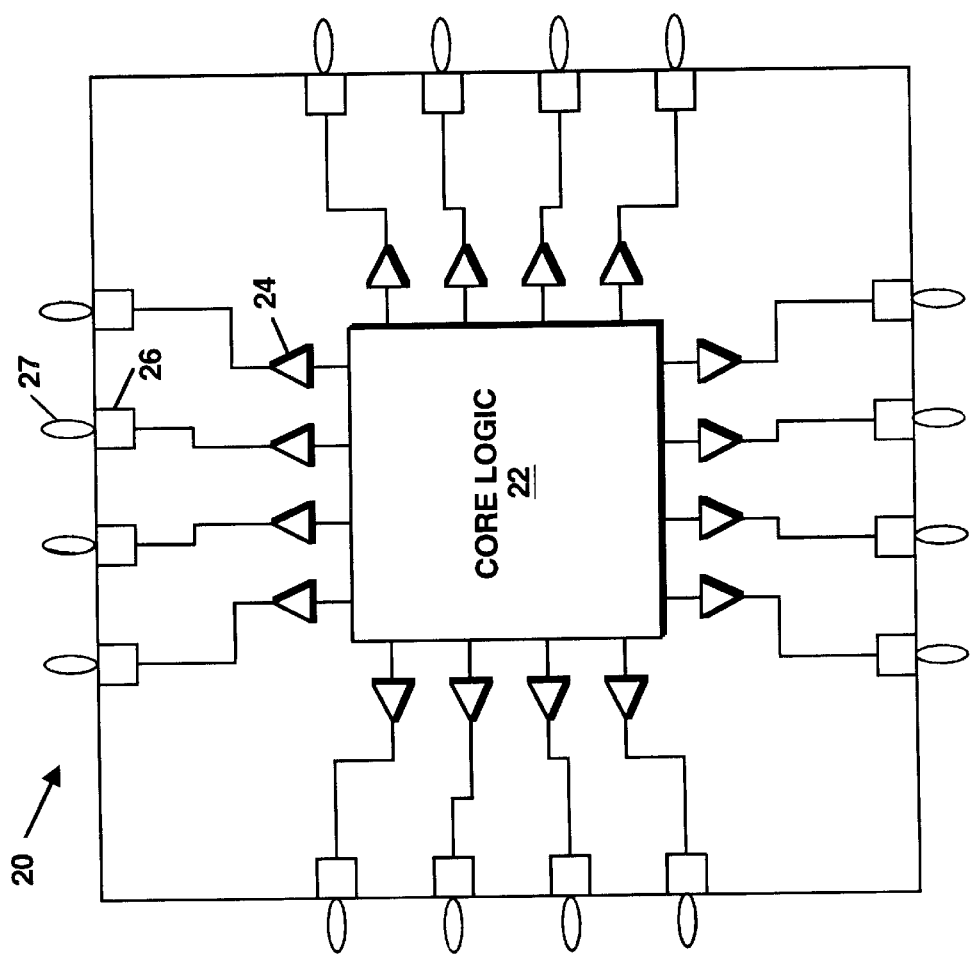
FIG. 2 depicts an integrated circuit which may be used in the computer system of FIG. 1.

Referring now to FIG. 2, a high level representation of an integrated circuit 20 is shown. Integrated circuit 20 is a representative integrated circuit which may be used in any of the groups 20a, 20b, or 20c in the computer system 10. Integrated circuit 20 is shown to comprise a core logic area 22, a plurality of output driver circuits such as driver 24, a plurality of output pads such as pad 26, and a plurality of pins such as pin 27.

During operation of integrated circuit 20, a low level signal is generated by the core logic area 22 and is passed to the driver circuit 24. The driver circuit 24 amplifies the signal to the appropriate output voltage and provides a much greater current sourcing ability. Driver circuit 24 also passes the signal to the output pad 26.

During signal transition periods a considerable amount of noise can be generated on the output pad 26 which corrupts the ideal signal levels to be provided via the associated output pin 27 to other connected IC's. This occurs because many I/O pads typically switch at the same time, which significantly increases the peak current requirements and therefore causes the output voltage to vary. Further, when an I/O signal is changing state, the edge rate typically generates high frequency noise that can couple onto the power supply which is driving it. The noise from transitioning signals can also couple onto a quiescent or non-transitioning signal, thus corrupting its quiescent voltage level.

The present invention overcomes these problems by driving selected I/O signals from two or more separate power supply networks. Transitioning I/O signals are driven by a Transition Power Supply network which is comprised of a high level supply network and a low level ground network. Because of the noise generated by edge rates and simultaneous transitions, transitioning I/O signals are inherently noisy and therefore the Transition Power Supply which drives them is also inherently noisy.

When an I/O signal reaches its quiescent voltage level, it is driven by a Quiescent Power Supply network which is also comprised of a high level supply network and a low level ground network. The Quiescent Power Supply is presumed quiet because it does not drive transitioning signals. Rather, the Quiescent Power Supply only drives I/O signals which have reached their steady state and are therefore not generating appreciable noise.

In the preferred embodiment, both the Quiescent and Transition Power Supplies can have voltage levels in the range from 1.5 volts to 5.0 volts. The only restriction on these voltages is that the Quiescent Power Supply should have a voltage higher or equal to the Transition Power Supply for correct circuit operation. However, a person of ordinary skill in the art could implement the present invention using other voltage levels and therefore the disclosure is not limited to the above specified voltage range.

Because the Transition and Quiescent Power Supply networks are separated, noise which would be induced by transitioning signals onto quiescent signals is greatly reduced without the addition of further power supply networks which increase the number of necessary ESD structures and reduce critical etch routing area.

Figure 3:
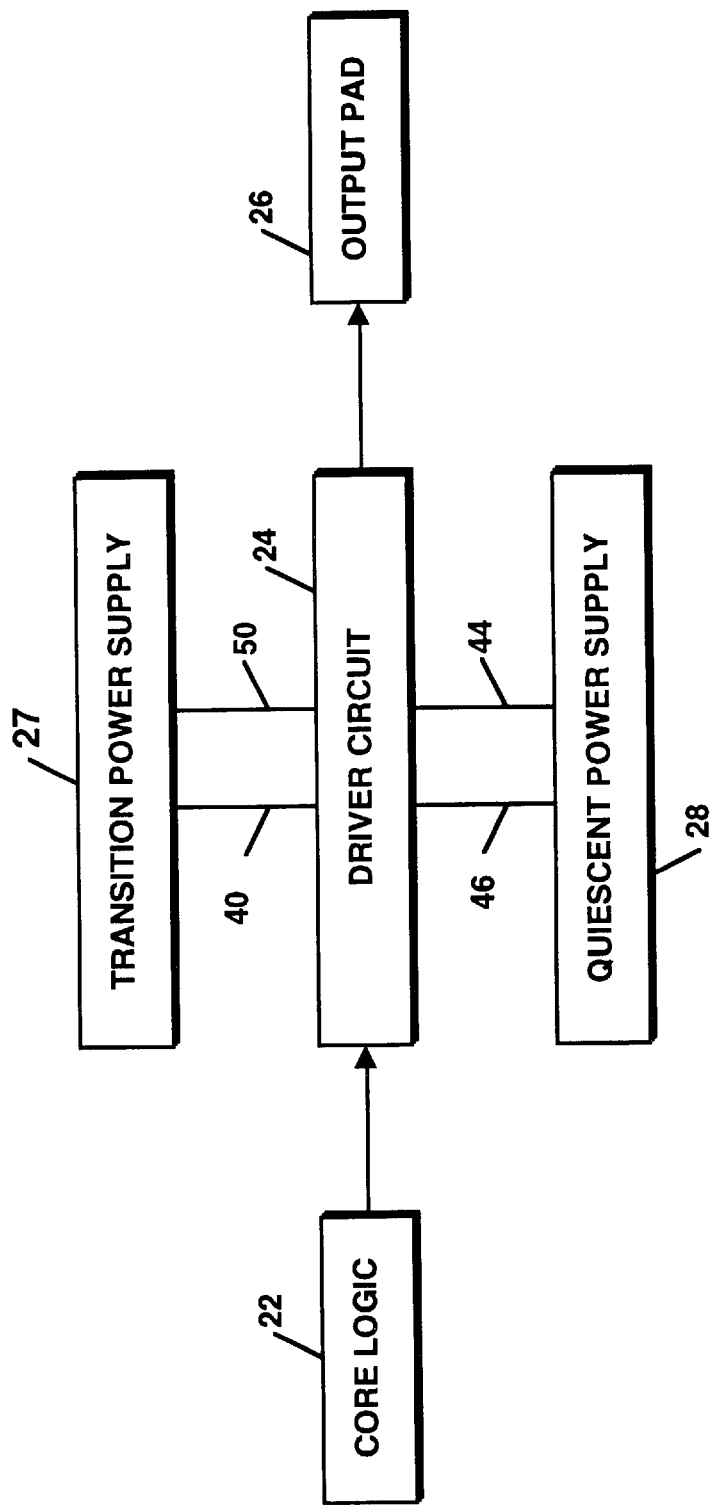
FIG. 3 depicts a block diagram of one embodiment of the invention including a driver circuit which may be used in the integrated circuit of FIG. 2.

For example, referring now to FIG. 3 a block diagram of the invention is depicted. The driver circuit controls switching between the Transition Power Supply network 27 (comprised of Transition Power Supply high level signal ($V_{tps}$,) 40, and low level ground signal ($Gnd_{tps}$) 50) and the Quiescent Power Supply network 28 (comprised of Quiescent Power Supply high level signal ($V_{qpd}$) 46 and low level ground signal ($Gnd_{qps}$) 44) based upon the state of the associated output pad 26. This method uses a single Quiescent Power Supply network 28 for groups of pins which switch at temporally separate times, but which include outputs that need to remain valid while other outputs in the group are switching. When core logic 22 conveys the required state of output signal 42 to driver circuit 24, the transistors connecting the Transition Power Supply 27 to output signal 42 are turned on. Thereafter, when output signal 42 reaches its quiescent state, these transistors are turned off and the transistor connecting the Quiescent Power Supply 28 to the output signal 42, is turned on.

Figure 4:
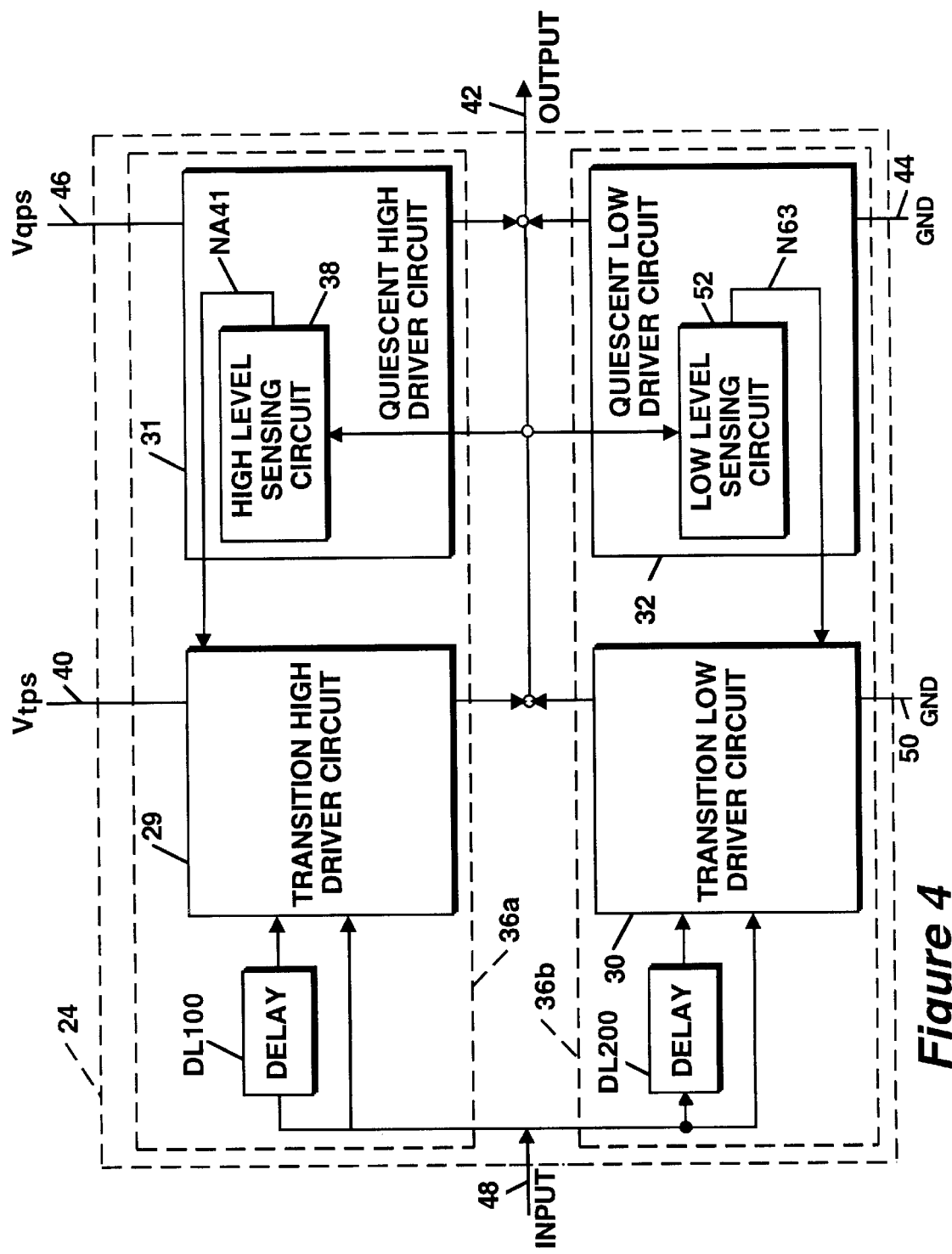
FIG. 4 depicts a block diagram of the driver circuit of FIG. 3.

Referring to FIG. 4, a block diagram of the driver circuit 24 is shown. The output driver circuit 24 is segmented into two main sections 36a and 36b. The first section 36 a controls driving and holding of the output signal 42 to a quiescent high level while the second section 36b controls driving and holding of the output signal 42 to a quiescent low level. Each of the two main sections is further divided into two subsections. The first subsection drives output signal 42 with a Transition Power Supply high level signal 40 or Transition Power Supply low level ground signal 50 when it is transitioning from one voltage level to another. The second subsection drives output signal 42 with a Quiescent Power Supply high level signal 46 or Quiescent Power Supply low level ground signal 44 when it has reached its steady state or quiescent voltage level.

Referring to section 36a, the input signal on line 48 is connected to delay device DL100 which delays the signal by approximately 1 nanosecond (ns). The output of DL100, along with the input signal 48, is fed to the Transition High Driver circuit 29 which also receives signal $V_{tps}$ on line 40. In general the operation of the Transition High Driver circuit 29 is such that when input signal 48 changes from a low level to a high level, two driving transistors are turned on. These transistors drive output signal 42 with the Transition Power Supply voltage $V_{tps}$ 40. The High Level Sensing circuit 38 detects when the output signal 42 reaches a high quiescent signal level and sends a signal, NA41, to the Transition High Driver circuit 29. This signal causes the two driving transistors to be shut off, and the Quiescent High Driver circuit 31 to turn its driving transistor on. This drives output signal 42 with the presumed clean, Quiescent Power Supply high level signal 46.

Referring to section 36b, the input signal on line 48 is connected to delay device DL200 which delays the signal by approximately 1 nanosecond. The output of DL200, along with input signal 48, is fed to the Transition Low Driver circuit 30 which also receives Transition Power Supply low level ground signal on line 50. In general the operation of the Transition Low Driver circuit 30 is such that when input signal 48 changes from a high level to a low level, two driving transistors are turned on. This drives output signal 42 with the presumed dirty, Transition Power Supply low level ground signal 50. The Low Level Sensing circuit 52 detects when the output signal 42 reaches a low quiescent signal level and sends a signal, NG3, to the Transition Low Driver circuit 30. Signal NG3 causes the two driving transistors to be shut off, and the Quiescent Low Driver circuit 32 to turn its driving transistor on to drive output signal 42 with the presumed clean, Quiescent Power Supply low level ground signal 44.

Figure 5:
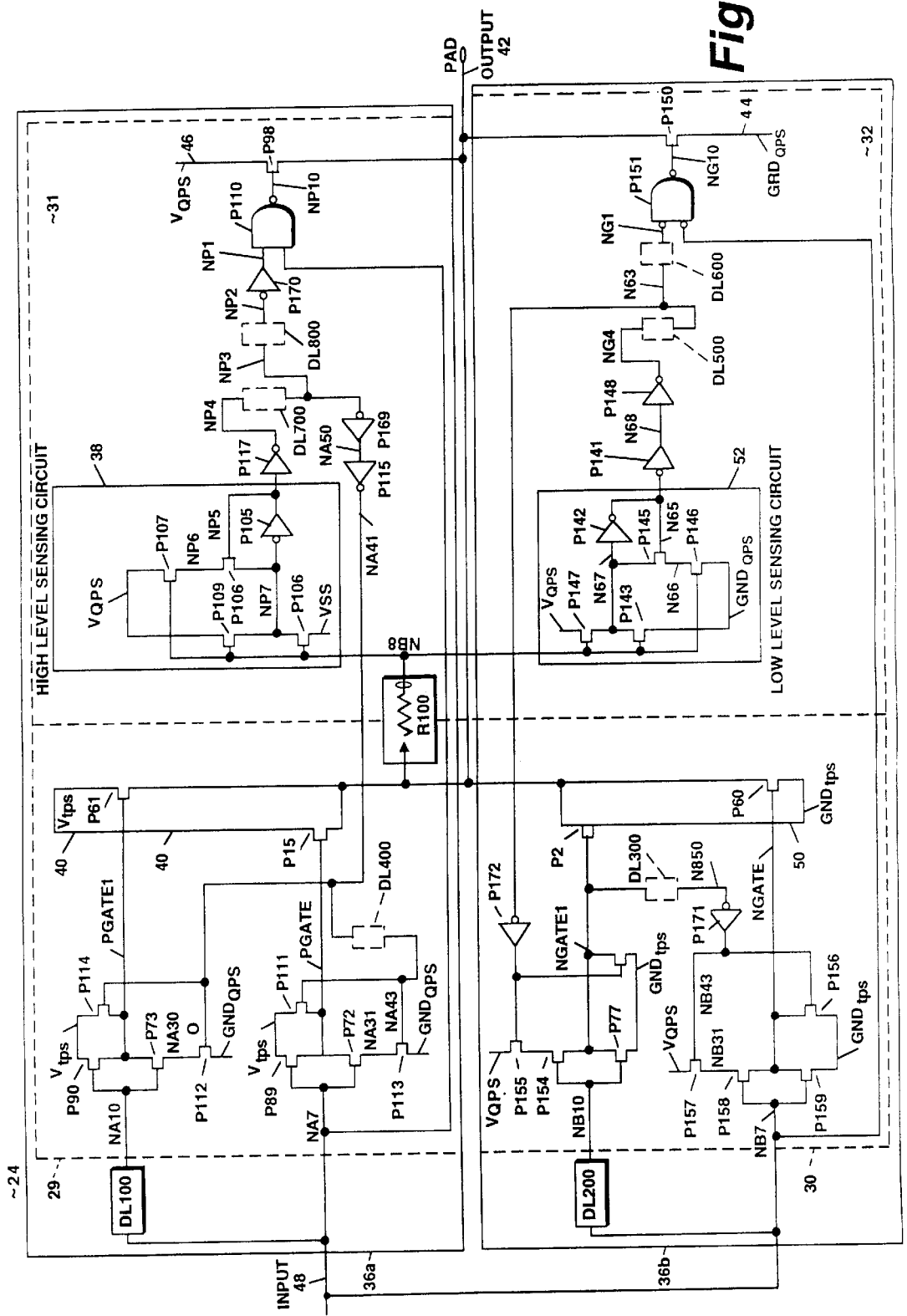
FIG. 5 depicts a schematic drawing of the complete driver circuit of FIG. 4.
Figure 6:
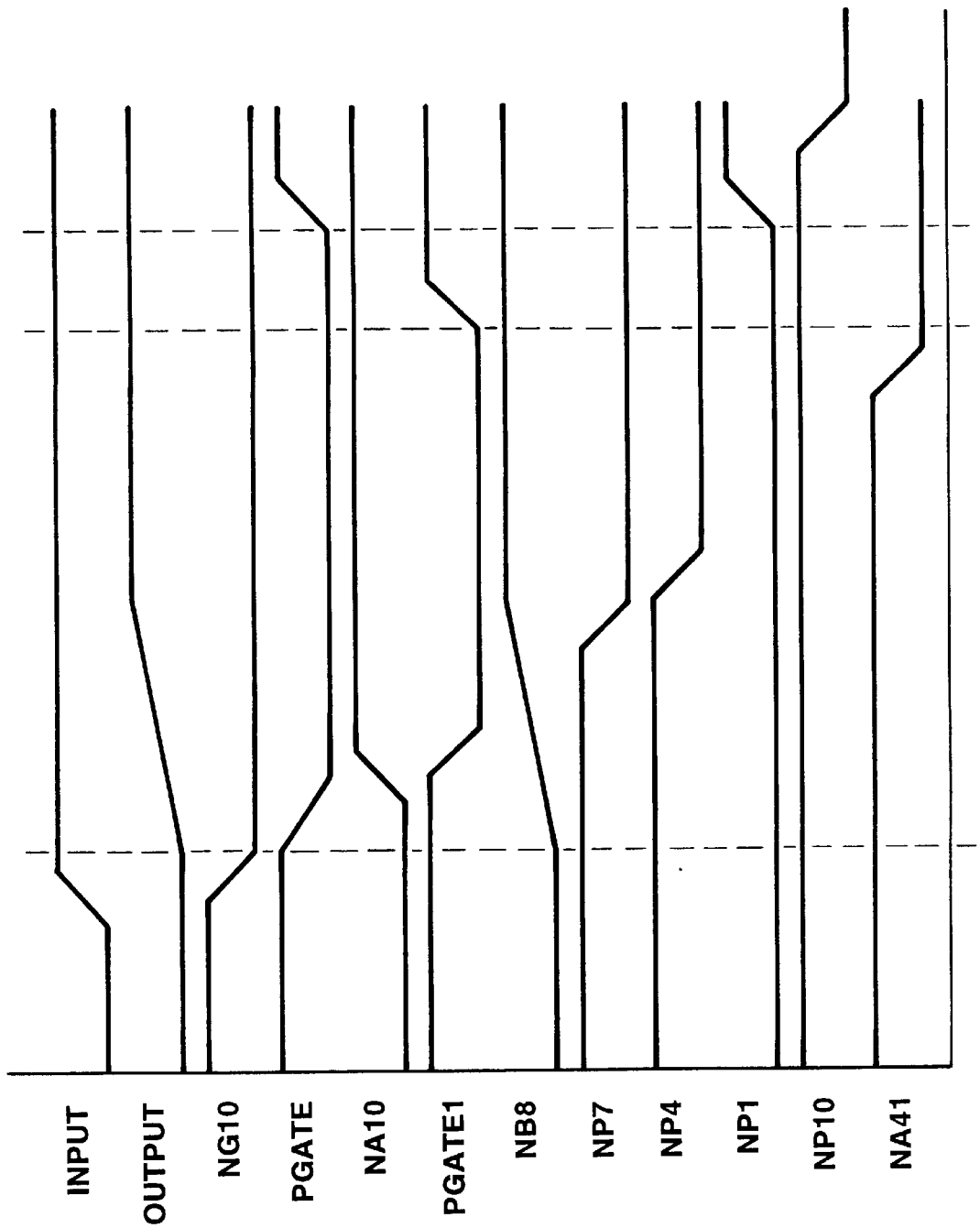
FIG. 6 depicts a timing diagram of the low to high transition operation of the driver circuit of FIG. 5.

Referring now to FIG. 5, one implementation of the output driver circuit 24, of FIG. 4, is shown and will be described with reference to FIG. 6. FIG. 6 is a timing diagram depicting a transition of the output signal 42 from a quiescent low level to a quiescent high level. The depicted operation of the circuit begins with the input and output at a steady state, quiescent low level. As shown coupled to output signal 42, a pull-up driving transistor P98 is turned off and pull-down driving transistor P150 is turned on, therefore allowing P150 to hold the output at a low level by providing a path from the output to the Quiescent Power Supply low level ground signal 44.

When the input signal on line 48 changes state from low to high, the feed forward path presents the new high level signal to one input of nor gate P151. The high input drives the output signal, NG10, of the NOR gate low, which turns off NMOS transistor P150 and therefore turns off the connection to the Quiescent Power Supply low level ground signal 44. When one input of nor gate P151 is at a high level, its output cannot be driven high and therefore any transition of signal NG1 will not affect its output level.

When the input signal on line 48 transitions to a high level, it turns off PMOS transistor P89 in the Transition High Driver circuit 29 and turns on NMOS transistor P72. As a result, PGATE is driven to a low level which then turns on the large PMOS driving transistor P15. The elements comprising the driver circuit should be chosen such that the transition of signal NG10, in the Quiescent Low Driver Circuit 32, occurs concurrently or slightly before the transition of signal PGATE. Transistor P15 provides a path from the Transition Power Supply high level signal $V_{tps}$ 40 to the output signal 42.

After input signal 48 becomes high, signal NA10, in the Transition Driver circuit, is also driven high. The delay between input signal 48 and NA10 is approximately 1 nanosecond, as determined by the value of delay element DL100. When signal NA10 transitions to the high level it turns off PMOS transistor P90 and turns on NMOS transistor P73. As a result, signal PGATE1 is driven to a low level which turns PMOS driving transistor P61 on. Transistor P61, along with transistor P15, drives the output signal 42 to the Transition Power Supply high level, referred to as signal $V_{tps}$ 40.

When the output signal 42 reaches a high level, ESD element R100 conveys this to the high level sensing circuit 38. In doing so, R100 drives signal NB8 to the same voltage as the output signal 42, minus the voltage drop across R100. When signal NB8 reaches a high level, it turns NMOS transistor P106 on. When P106 is turned on, it enables a path to the Quiescent Power Supply low level ground signal 44 which pulls signal NP7 low. Signal NP7 is then buffered by two inverters before becoming signal NP4. Signal NP4 is the source of both a feedback path and a feedforward path. The feedforward path is for turning PMOS transistor P98 on. The low level signal NP4 is delayed by two delay elements DL700 and DL800 to become signal NP2 which is thereafter inverted by P170 before being presented as signal NP1 to the two-input nand gate P110.

The value of delay elements DL800, DL70, and DL400 should be nominally chosen such that driving transistor P98 is turning on when driving transistor P15 is turning off. This design criteria is met when the time delay for signal NP3 to propagate to the gate terminal of transistor P98, turning it on, is very nearly equal to the time delay for signal NP3 to propagate to the gate terminal of transistor P15, turning it off. In the preferred embodiment, delay elements DL800, DL700, and DL400 have approximate values of 3 ns, 2 ns, and 3 ns respectfully. Also, gates used in the preferred embodiment have approximate propagation delays of 0.4 ns, turn-on delays of 0.5 ns, and turn-off delays of 0.5 ns. Therefore the time delay imposed by the sum of DL800, inverter P170, nand gate P110, and the turn-on delay of P98 (4.3 nanoseconds in the preferred embodiment) should nominally equal the sum of imposed delays of inverter P169, inverter P115, delay element DL400, the turn-on delay of transistor P111, and the turn-off delay of P15 (4.8 nanoseconds in the preferred embodiment). This will ensure that the output signal 42 will never be driven by the Transition Power Supply and the Quiescent Power Supply for an extended period of time.

Continuing with the timing analysis, since the other input to P110 has already been driven high by the input signal 48, when signal NP1 goes high the output of nand gate P110, signal NP10, is driven low and transistor P98 is turned on. When transistor P98 turns on, it allows the output signal 42 to be driven by the Quiescent Power Supply high level signal 46.

While this feedforward path is being traversed, signal NP4 propagates through the feedback path. This feedback path buffers signal NP4 through delay element DL700 and inverters P169 and P115 to produce a low level on signal NA41. This shuts off NMOS transistor NA30, in the Transition High Driver circuit 29, and turns on PMOS transistor P114, which in turn drives signal PGATE1 high and shuts transistor P61 off. After a delay specified by element DL400, the same operation is performed for the other driving transistor i.e. NMOS transistor P113 is shut off and PMOS transistor P111 turned on. When transistor P111 turns on, it drives signal PGATE to a high level which shuts off PMOS driving transistor P15. Therefore, when transistors P61 and P15 are both turned off the output signal is no longer driven by the Transition Power Supply high level signal 40, but is driven by the Quiescent Power Supply high level signal 46.

The overall operation which the circuit performs is that during the transition period from a low to a high value, the output signal 42 is supplied by the Transition Power Supply high level signal 40. When the output signal 42 reaches the required high signal level it is supplied by the Quiescent Power Supply high level signal 46 and Transition Power Supply 40 is shut off. Therefore, noise from transitioning signals will not couple onto quiescent steady state signals.

Figure 7:
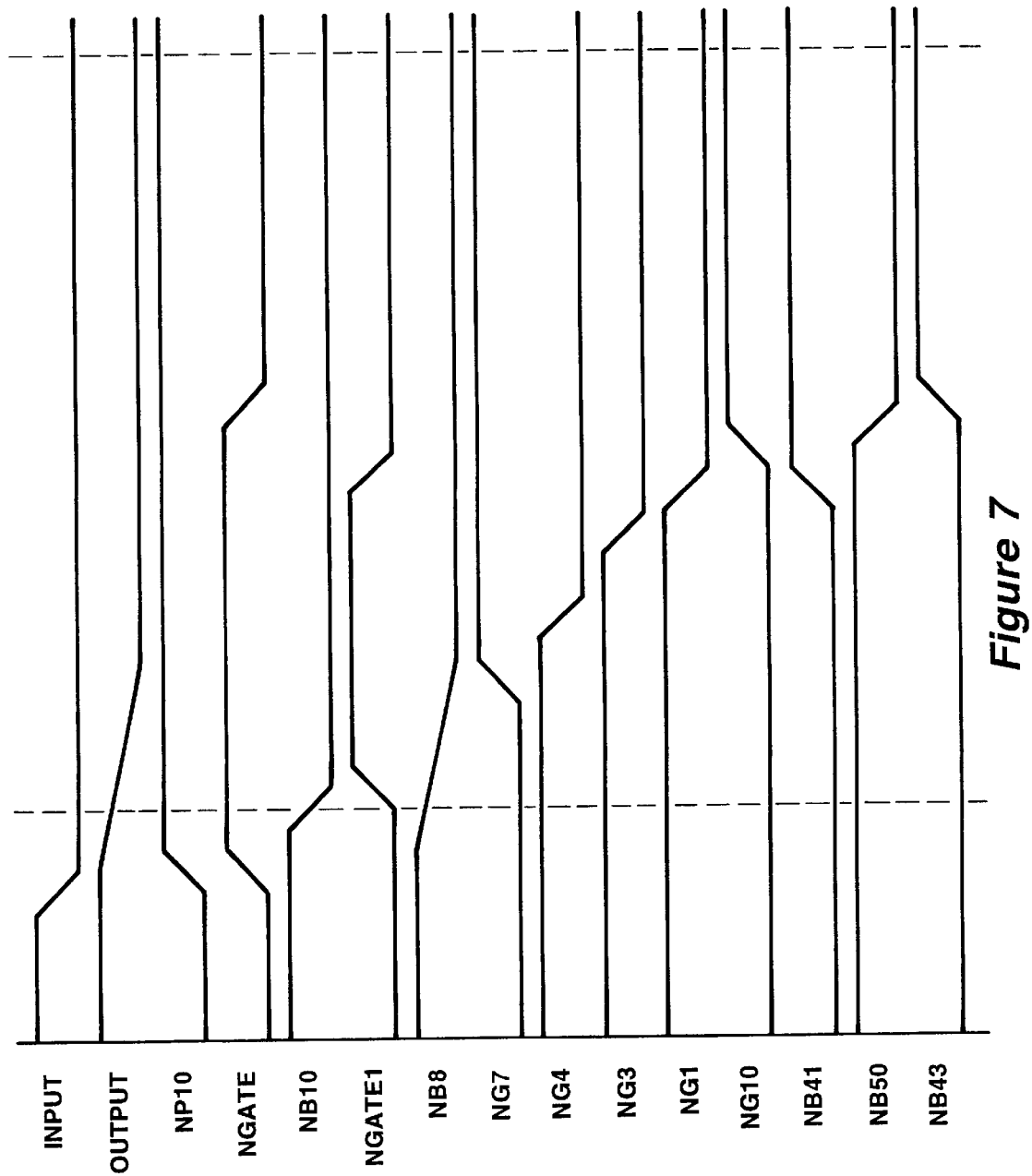
FIG. 7 depicts a timing diagram of the high to low transition operation of the driver circuit of FIG. 5.

Referring now to FIG. 7, a timing diagram depicting the operation of the circuit with input signal 48 transitioning from a quiescent high state to a quiescent low state is shown. When the input signal 48 changes from a high level to a low level, the feedforward path first presents the low level input signal to an input of nand gate P110. The low input causes the output of nand gate P110, signal NP10, to go high which in turn shuts off PMOS driving transistor P98. When P98 shuts off, the output signal is no longer driven by the Quiescent Power Supply high level signal 46.

When input signal 48 in the Transition Low Driver circuit 30 is driven low, PMOS transistor P158 is turned on and NMOS transistor P159 is turned off. Since signal NB43 was at a high level when output signal 42 was at a quiescent high level, and because delay element DL300 delays the transition of signal NB43, PMOS transistor P157 remains turned on. Therefore, transistors P157 and P158 together provide a high level on signal NGATE, which turns NMOS transistor P60 on. Transistor P60 is a large NMOS driving transistor which drives the output signal 42 with the Transition Power Supply low level ground signal 50. The elements comprising the driver circuit should be chosen such that the transition of signal NP10 occurs concurrently or slightly before the transition of signal NGATE. After the low level input signal 48 passes through delay element DL200, signal NB10 is also driven low. Signal NB10 going low turns PMOS transistor P154 on. Because PMOS transistor P155 is still turned on, signal NGATE1 is driven with a high level. NGATE1 turns NMOS driving transistor P2 on which, along with transistor P60, drives the output signal 42 with the Transition Power Supply low level ground signal 50.

The output signal 42 is conveyed to the low level sensing circuit 52, through ESD element R100 and signal NB8. When signal NB8 reaches a low level, PMOS transistor P147 is turned on and NMOS transistors P143 and P146 are turned off. Transistor P147 drives signal NG7 high. Signal NG7 is inverted three times to produce low level signal NG4 which in turn is delayed by delay element DL500 to produce low level signal NG3.

The value of delay elements DL500, DL600, and DL300 should be nominally chosen such that driving transistor P150 is turning on when driving transistor P60 is turning off. In the preferred embodiment, delay elements DL500, DL600, and DL300 have approximate values of 3 ns, 2 ns, and 3 ns respectfully. Also, gates used in the preferred embodiment have approximate propagation delays of 0.4 ns, turn-on delays of 0.5 ns, and turn-off delays of 0.5 ns. This design criteria is met when the time delay for signal NG3 to propagate to the gate terminal of transistor P150, turning it on, is nominally equal to the time delay for signal NG3 to propagate to the gate terminal of transistor P60, turning it off. Therefore the time delay imposed by the sum of DL600, nor gate P151, and the turn-on time of P150 (2.9 nanoseconds in the preferred embodiment) should nominally equal the sum of imposed delays of delay element DL300, inverter P171, the turn-on time of transistor P156, and the turn-off time of P60 (4.4 nanoseconds in the preferred embodiment). This will ensure that the output signal 42 will never be driven by the Transition Power Supply ground network 50 and the Quiescent Power Supply ground network 44 for an extended period of time.

Continuing with the timing analysis, signal NG3 is the basis for two paths, a feed forward path and a feedback path. The feedforward path will be described first. Traversing the feedforward path, low level signal NG3 is delayed by delay element DL600 to generate low level signal NG1 which is presented to an input of nor gate P151. Because the other input of P151 is already low from the feed forward path of input signal 48, the output of P151, signal NG10, is driven high which turns NMOS driving transistor P150 on. Transistor P150 drives the output signal 42 with the Quiescent Power Supply low level ground signal 44.

The feedback path, which signal NG3 is the basis, is used to shut off the connection from the Transition Power Supply ground network 50 to the output signal 42 when 42 reaches its quiescent low level. Therefore, low level signal NG3 is fed back to inverter P172 and inverted to drive signal NB41 high. This transition shuts off PMOS transistor P155 and turns on NMOS transistor P153. When transistor P153 turns on, it drives signal NGATE1 low. This shuts off NMOS driving transistor P2 which previously drove the output signal 42 with the Transition Power Supply low level ground signal 50. After the delay specified by delay element DL300, signal NB50 is driven with the low value of signal NG3. Low level signal NB50 is then inverted through inverter P171 which presents a high level signal to the gates of transistors P157 and P156. Therefore, PMOS transistor P157 is shut off and NMOS transistor P156 is turned on. When transistor P156 turns on, it drives signal NGATE low which turns off NMOS driving transistor P60. At this point the output signal 42 is driven only by the Quiescent Power Supply ground 44 and remains at its quiescent low level until the next transition of input signal 48 causes the process described with regard to FIG. 6 to begin.

Thus, a circuit has been disclosed which prevents noise from transitioning signals to couple onto quiescent signals without the use of individual power supply networks and without significantly reducing the available chip area for routing of critical signals. It should be noted that the embodiment shown in FIG. 5 is simply one implementation of a circuit that could perform this function. Other implementations could be provided by one of skill in the art in accordance with the constraints of the given design.

Referring now to FIG. 8, an alternative embodiment of the present invention is shown comprising the same elements as specified with respect to FIGS. 4 and 5. In the second embodiment, Transition Power Supply low level ground signal 50 is coupled to Quiescent Power Supply low level ground signal 44. Transition Power Supply high level signal, on line 40, and Quiescent Power Supply high level signal, on line 46, remain separate. Separation of signals 40 and 46 retains the noise suppression qualities for high level signals. Therefore, this embodiment can be implemented in driver circuits where noise levels for low transitioning signals are minimal, or where they are not a critical design requirement.

Having described a preferred embodiment of the invention, it will now become apparent to one of ordinary skill in the art that other embodiments incorporating its concepts may be used. It is felt, therefore, that this embodiment should not be limited to the disclosed embodiment, but rather should be limited only by the spirit and scope of the appended claims.

What is claimed is:

1. An integrated circuit comprising:
   a core logic area for generating a first logic level for an electrical signal, said first logic level corresponding to a first voltage level;
   a driver circuit for amplifying said first logic level to a second voltage level and for minimizing electrical noise on said output signal by driving said output signal using a first power supply and a second power supply, each power supply alternatively selected depending upon the switching state of the electrical signal, and wherein said first power supply and said second power supply comprise voltage levels that are not equivalent.

2. The integrated circuit of claim 1, wherein said driver circuit further comprises:
   a first circuit portion for driving an output signal using a first power supply network when said output signal is transitioning from a low state to a high state;
   a second circuit portion for driving said output signal with a second power supply network when said output signal is in a quiescent high state;
   a third circuit portion for driving said output signal with a third power supply network when said output signal is transitioning from a high state to a low state;
   a fourth circuit portion for driving said output signal with a fourth power supply network when said output signal is in a quiescent low state.

3. The integrated circuit of claim 2, wherein said second circuit portion further comprises:
   a high level sensing circuit comprising means for determining when said output signal reaches said quiescent high state and for conveying this information to said first circuit.

4. The integrated circuit of claim 2, wherein said fourth circuit portion further comprises:
   a low level sensing circuit comprising means for determining when said electrical signal reaches said quiescent low state and for conveying this information to said third circuit portion.

5. The integrated circuit of claim 2 wherein said third power supply and said fourth power supply are electrically connected.

6. The integrated circuit of claim 2 wherein said third power supply and said fourth power supply are electrically independent.

7. A driver circuit for limiting electrical noise while driving an output signal comprising:
   a first circuit portion for driving an output signal with a first power supply network when said output signal is transitioning from a low state to a high state said first power supply network having a first voltage magnitude;
   a second circuit portion for driving said output signal with a second power supply network when said output signal is in a quiescent high state, said second power supply network having a second voltage magnitude, said second voltage magnitude being different from said first voltage magnitude;
   a third circuit portion for driving said output signal with a third power supply network when said output signal is transitioning from a high state to a low state;
   a fourth circuit portion for driving said output signal with a fourth power supply network when said output signal is in a quiescent low state.

8. The driver circuit of claim 7 wherein said second circuit portion further comprises:
   a high level sensing circuit comprising means for determining when said output signal reaches said quiescent high state and for conveying this information to said first circuit portion.

9. The driver circuit of claim 8 wherein said fourth circuit portion further comprises:
   a low level sensing circuit comprising means for determining when said electrical signal reaches said quiescent low state and means for conveying this information to said third circuit portion.

10. The driver circuit of claim 9 wherein said third power supply network and said fourth power supply network are electrically connected.

11. The driver circuit of claim 9 wherein said third power supply network and said fourth power supply network are electrically independent.

12. A computer system comprising:

A central processing unit;

A memory system for storing programs to be run on said central processing unit;

An I/O system for communicating with I/O devices;

A system bus for connecting said central processing unit, said memory system, said cache memory system, and said I/O system;

At least one integrated circuit comprising a driver circuit for limiting electrical noise on a quiescent signal comprising:

a first circuit portion for driving said output signal using a first power supply network when said output signal is transitioning from a low state to a high state, said first power supply network having a first voltage magnitude;

a second circuit portion for driving said output signal with a second power supply network when said output signal is in a quiescent high state, said second power supply network having a second voltage magnitude, said second voltage magnitude being different from said first voltage magnitude;

a third circuit portion for driving said output signal with a Third Power Supply network when said output signal is transitioning from a high state to a low state;

a fourth circuit portion for driving said output signal with a fourth power supply network when said output signal is in a quiescent low state.

13. The computer system of claim 12 wherein said second circuit portion further comprises:

a high level sensing circuit comprising means for determining when said output signal reaches said quiescent high state and means for conveying this information to said first circuit portion.

14. The computer system of claim 13 wherein said fourth circuit portion further comprises:

a low level sensing circuit comprising means for determining when said output signal reaches said quiescent low state and for conveying this information to said third circuit portion.

15. The computer system of claim 12 wherein said third power supply network and said fourth power supply network are electrically connected.

16. The computer system of claim 12 wherein said third power supply network and said fourth power supply network are electrically independent.

* * * * *